(12) United States Patent
Yanagigawa

(10) Patent No.: US 7,884,421 B2
(45) Date of Patent: Feb. 8, 2011

(54) SEMICONDUCTOR DEVICE AND METHOD OF MANUFACTURING THE SAME

(75) Inventor: Hiroshi Yanagigawa, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 369 days.

(21) Appl. No.: 11/882,854

(22) Filed: Aug. 6, 2007

(65) Prior Publication Data

US 2008/0029813 A1 Feb. 7, 2008

(30) Foreign Application Priority Data

Aug. 7, 2006 (JP) ............... 2006-214738

(51) Int. Cl.
*H01L 29/66* (2006.01)
(52) U.S. Cl. .............. 257/335; 257/E29.256; 257/E29.027
(58) Field of Classification Search .......... 257/335, 257/E29.256, 336, 337, 338, 339, 341, 342, 257/343, 344, E29.027
See application file for complete search history.

(56) References Cited

U.S. PATENT DOCUMENTS 7,122,861 B2 * 10/2006 Mori ...................... 257/339
2007/0034944 A1 * 2/2007 Xu et al. ................ 257/335

FOREIGN PATENT DOCUMENTS

JP     2005-167262     6/2005

* cited by examiner

*Primary Examiner*—Matthew C Landau
*Assistant Examiner*—Jessica Hall
(74) *Attorney, Agent, or Firm*—McGinn Intellectual Property Law Group, PLLC

(57) ABSTRACT

In a high voltage MOS transistor, in a portion immediately below the gate electrode, peaks of concentration distribution in depth direction of a first conductivity type impurity and a second conductivity type impurity in the drain offset region are in the same depth, the second conductivity type impurity being higher concentrated than the first conductivity type impurity.

16 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and particularly to a high voltage MOS transistor.

2. Description of Related Art

An example of a conventional high voltage MOS transistor is shown in FIGS. 6A and 6B. FIG. 6A is a plan view of the conventional high voltage MOS transistor. FIG. 6B is a cross-sectional diagram taken along the line VIB-VIB of FIG. 6A. Incidentally, FIG. 6A shows a state when a gate electrode is removed and a gate electrode area is indicated by a chain line.

In FIGS. 6A and 6B, a conventional high voltage MOS transistor 1 includes a $P^{--}$ type silicon substrate 2, a $P^-$ type punch through prevention region 3, an $N^-$ type drain offset region 4, an $N^+$ type source region 5, an $N^+$ type drain region 6, a gate insulating film 7, a gate electrode 9, a $P^+$ type back gate region 10 and a channel region 11.

The gate electrode 9 is formed over the $P^{--}$ type silicon substrate 2 with the gate insulating film 7 interposed therebetween.

The $N^+$ type source region 5 is formed to be adjacent to one end of the gate electrode 9 in plan view.

The $N^-$ type drain offset region 4 for obtaining high voltage characteristics is formed to face the source region 5 with the channel region 11 interposed therebetween.

The $N^+$ type drain region 6 is formed away from another end of the gate electrode 9 to be included in the drain offset region 4.

The $P^-$ type punch through prevention region 3 is formed to surround the drain offset region 4 in plan view.

Moreover, the $P^+$ type back gate region 10 for isolation is formed in the peripheral portion of the active region.

The reason why the drain offset region 4 and the punch through prevention area 3 are provided to be in contact with each other is to prevent from an extension of diffusion in the horizontal direction so as to reduce the size in plan view (See for example Japanese Unexamined Patent Application Publication No. 2005-167262).

In the conventional high voltage MOS transistor 1 including the N type drain offset region 4 and the P type punch through prevention region 3 provided to be in contact with each other over the surface of the P type silicon substrate 2, when applying a high voltage to the drain region 6, as shown in FIG. 7A, a depletion layer (indicated by the broken line) expands in a PN junction surface between the drain offset region 4 and the silicon substrate 2 and in another PN junction surface between the drain offset region 4 and the punch through prevention region 3, thereby reducing an electric field.

Here, as the P type impurity concentration of the silicon substrate 2 is lower than the P type impurity concentration of the punch through prevention region 3, the depletion layer width "a" generated in the PN junction surface between the silicon substrate 2 and the drain offset region 4 is wider than the depletion layer width "b" generated in the PN junction surface between the punch through prevention region 3 and the drain offset region 4.

Accordingly, a so called avalanche breakdown, which is generated when exceeding a critical electric field, is generated in the PN junction surface between the punch through prevention region 3 and the drain offset region 4.

Furthermore, as shown in FIG. 7B, in the PN junction surface between the punch through prevention region 3 and the drain offset region 4, especially immediately below the gate electrode 9, the avalanche breakdown could be generated, and when an avalanche current Ia flows, a parasitic bipolar transistor (NPN) Tr operates and a breakdown voltage between drain and source could decline.

SUMMARY

In one embodiment, a gate electrode formed over a semiconductor substrate of a first conductivity type with a first insulating film interposed therebetween, a source region and a drain offset region of a second conductivity type formed away and facing each other over a surface of the semiconductor substrate with a channel region formed immediately below the gate electrode interposed therebetween, a drain region of the second conductivity type formed to be included in the drain offset region and a punch through prevention region of the first conductivity type formed to be in contact with the drain offset region. In a portion immediately below the gate electrode, peaks of concentration distribution in depth direction of a first conductivity type impurity and a second conductivity type impurity in the drain offset region are in the same depth, where the second conductivity type impurity is higher concentrated than the first conductivity type impurity.

In another embodiment, a method of manufacturing a semiconductor device includes ion implanting a second conductivity type impurity to a predetermined region over a surface of a semiconductor substrate to form a drain offset region, ion implanting a first conductivity type impurity to the surface of the semiconductor substrate including the drain offset region to form a punch through prevention region to be in contact with the drain offset region, where the first conductivity type impurity is lower concentrated than the second conductivity impurity of the drain offset region and forming a first insulating film over the surface of the semiconductor substrate to be a gate insulating film. In a portion immediately below the gate electrode, peaks of concentration distribution in the depth direction of the first conductivity type impurity and the second conductivity type impurity in the drain offset region are in the same depth, where the second conductivity type impurity is higher concentrated than the first conductivity type impurity.

According to the semiconductor device and a method of manufacturing the same of the present invention, the breakdown voltage in the PN junction surface between the drain offset region and punch through region immediately below the gate electrode can be improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The present invention provides a semiconductor for improving the breakdown voltage of the PN junction surface between the drain offset region and punch through prevention region immediately below the gate electrode and a method of manufacturing the same, by making the peak in concentration distribution in the depth direction of the first conductivity type impurity be in the same depth of the peak in concentration distribution in the depth direction of the second conductivity type impurity which is higher concentrated than the first conductivity type impurity and by increasing the expansion width of the depletion layer of the PN junction surface between the drain offset region and punch through prevention region.

An example of a high voltage MOS transistor according to the present invention is described herein after in detail with reference to FIGS. 1A to 2B.

Figure 1A:
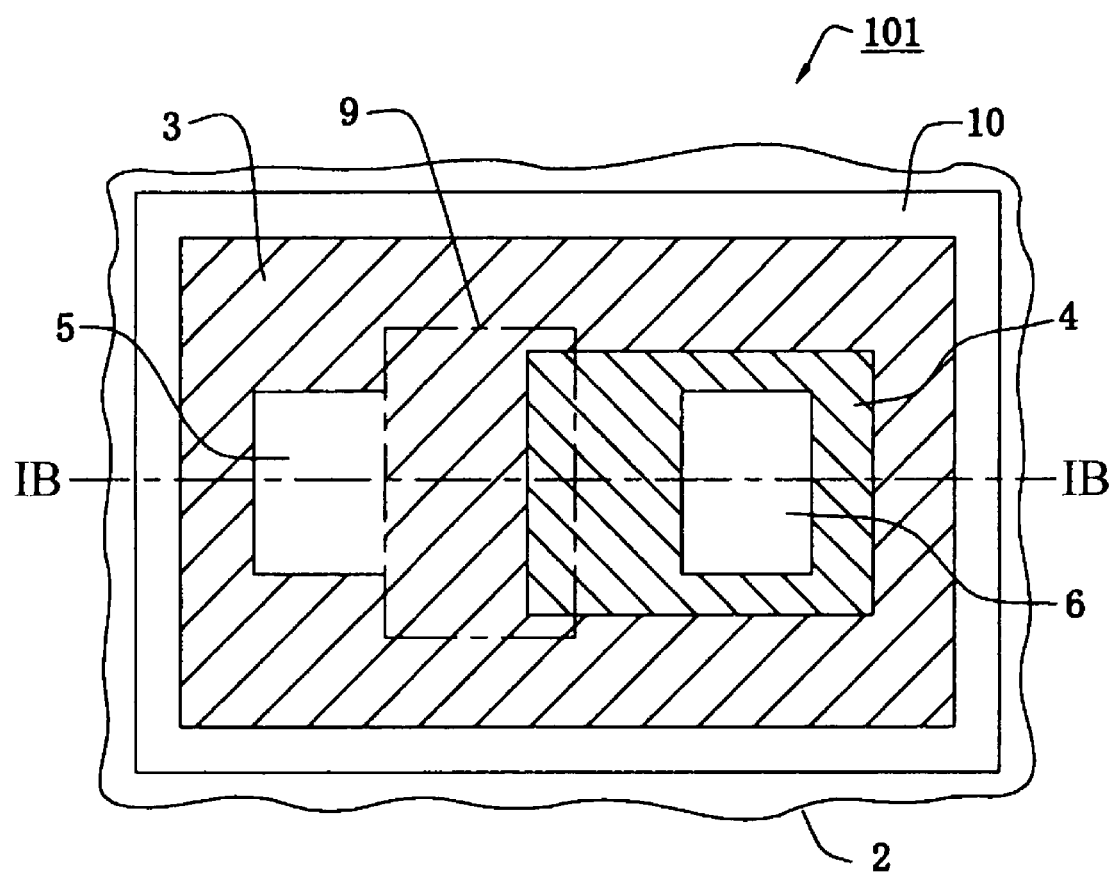
FIG. 1A is a plan view of a high-voltage MOS transistor according to the present invention.
Figure 1B:
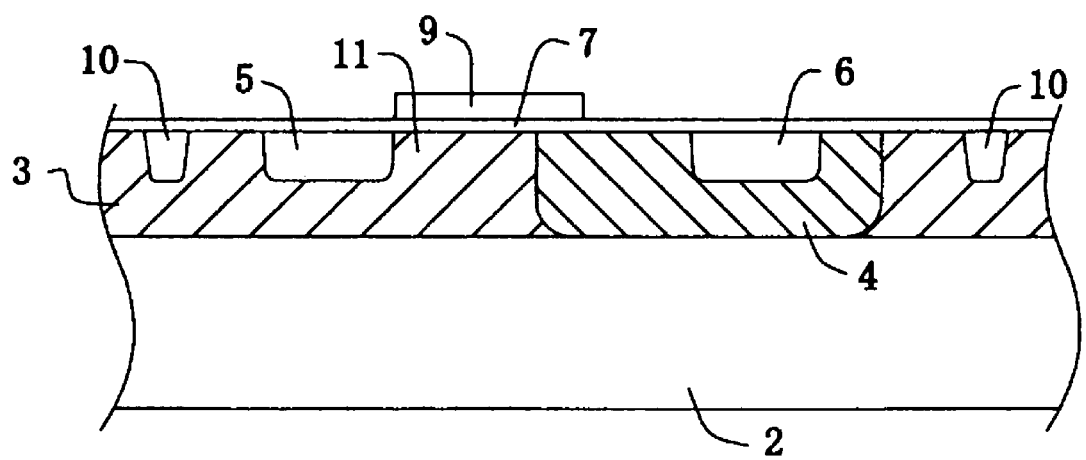
FIG. 1B is a cross-sectional diagram taken along the line IB-IB of FIG. 1A.

FIG. 1A is a plan view of the high voltage MOS transistor according to the present invention. FIG. 1B is a cross-sectional diagram taken along the line IB-IB of FIG. 1A. Incidentally, FIG. 1A shows a state when a gate electrode is removed and a gate electrode region is indicated by a chain line. In FIGS. 1A and 1B, components identical to those in FIGS. 6A to 7B are denoted by reference numerals identical to those therein.

Figure 2A:
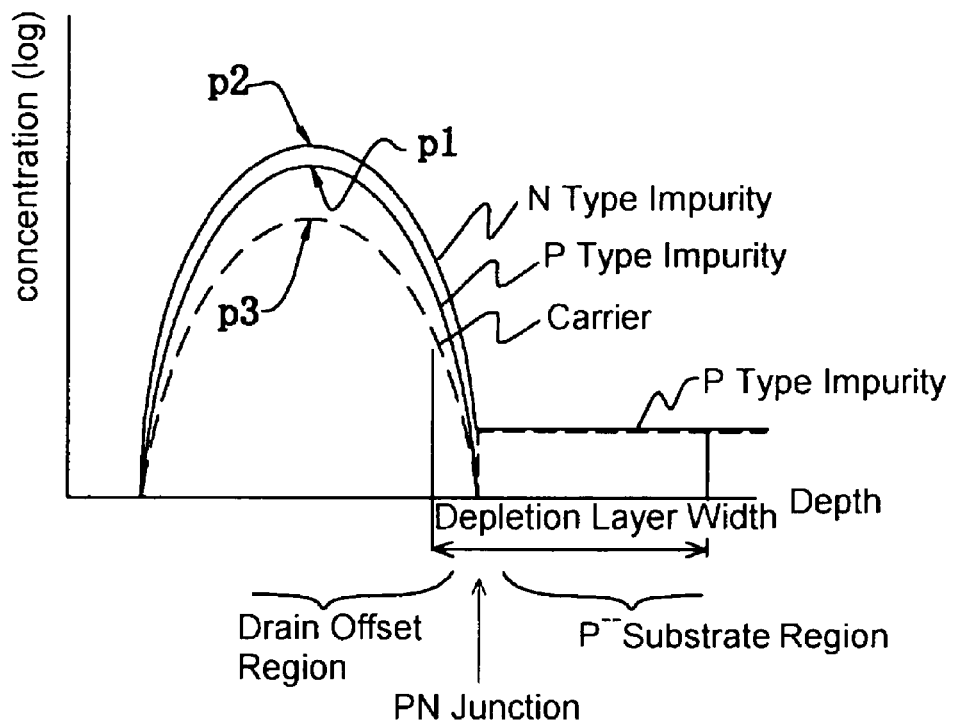
FIGS. 2A and 2B are schematic diagrams of concentration distribution of impurities and carriers in a drain offset region.
Figure 2B:
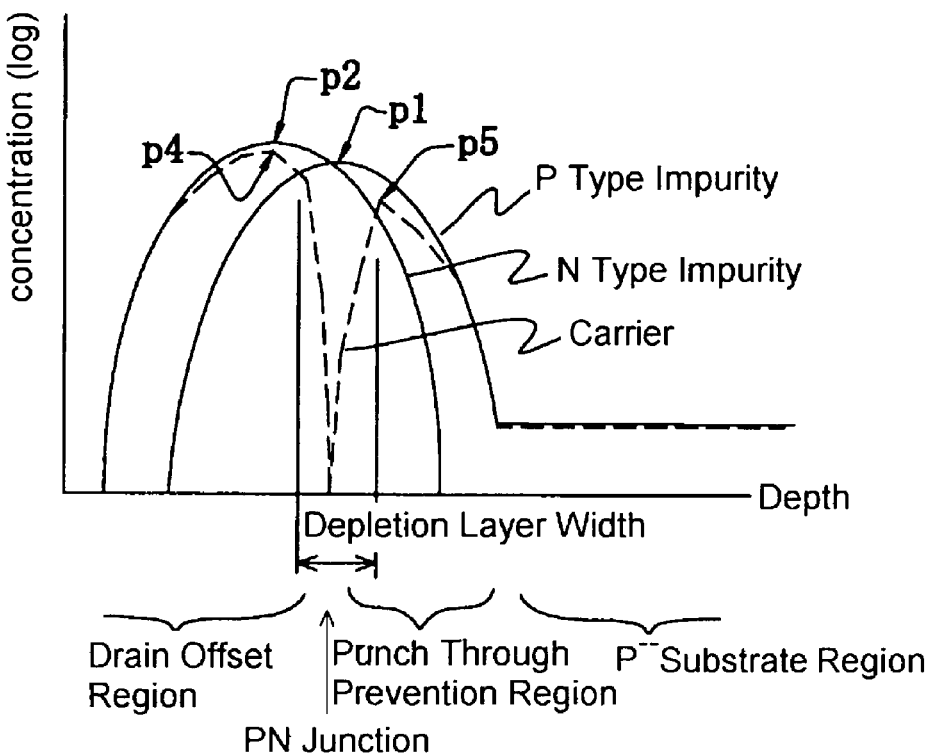

FIGS. 2A and 2B are schematic diagrams for explaining the concentration distribution of impurities and carriers in a drain offset region. In FIGS. 2A and 2B, the vertical axis is a concentration (logarithm) and horizontal axis is a depth from the substrate surface.

In FIGS. 1A and 1B, a high-voltage MOS transistor 101 according to the present invention includes a $P^{--}$ type silicon substrate 2 and $P^-$ type punch through prevention region 3 of a first conductivity type, $N^-$ type drain offset region 4, $N^+$ type source region 5 and $N^+$ type drain region 6 of a second conductivity type, gate insulating film 7 as a first insulating film, gate electrode 9, $P^+$ type back gate region 10 and channel region 11.

The gate electrode 9 is formed over the surface of the $P^{--}$ type silicon substrate 2 with the gate insulating film 7 interposed therebetween.

The $N^+$ type source region 5 is formed to be adjacent to one end of the gate electrode 9 in plan view.

The $N^-$ type drain offset region 4 for obtaining high voltage characteristics is formed to face the source region 5 with the channel region 11 interposed therebetween.

The $N^+$ type drain region 6 is formed away from another end of the gate electrode 9 to be included in the drain offset region 4.

The $P^-$ type punch through prevention region 3 is formed to surround the drain offset region 4 in plan view.

Moreover, the $P^+$ type back gate 10 for isolation is formed in the peripheral portion of the active region.

Here, to prevent punch through, it is effective to uniform the levels of the diffusion depth of the punch through prevention region 3 and that of the drain offset region 4, however it is not necessary.

Additionally, in the drain offset region 4, P and N type impurities are doped together. As shown in FIG. 2A, the impurities are formed so that peak p1 of the concentration distribution in depth direction for the P type impurity and peak p2 of the concentration distribution in depth direction for the N type impurity are conformed each other in the same depth.

Furthermore, a difference between the two peaks p1 and p2 is made to be small, not more than $10/cm^3$.

As described above, when forming to conform the depth position of two peaks p1 and p2 for the P/N type impurities concentration distributions in the drain offset region 4, the distribution (indicated by the broken line in FIG. 2A) of effective carrier concentration which is determined by impurity concentration difference between N and P type is formed to be convex shape having a peak p3 in the same depth as the peaks p1 and p2 of the impurity concentration distribution.

Therefore, as the depletion layer width of the PN junction portion is determined by a carrier concentration profile having the peak p3 on the punch through prevention region 3 side and a low carrier concentration of a low concentrated silicon substrate on the silicon substrate 2 side, it is possible to achieve a wide width for the depletion layer.

That is, in the PN junction surface between the punch through prevention region 3 and the drain offset region 4 according to this embodiment, the expansion width of the depletion layer is large and an avalanche breakdown is rarely generated, thereby obtaining a high breakdown voltage.

Next, a manufacturing method of the high voltage MOS transistor 101 is described hereinafter in detail with reference to FIGS. 3A to 3D. FIGS. 3A to 3D are cross-sectional diagrams.

Figure 3A:
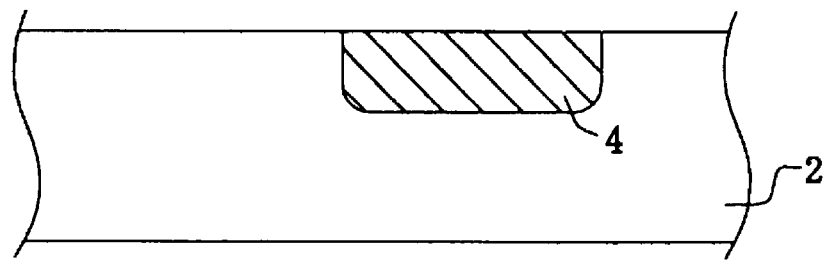
FIGS. 3A to 3D are cross-sectional diagrams of a manufacturing method of the high voltage MOS transistor according to the present invention.

Firstly as shown in FIG. 3A, in a predetermined area of the surface of the $P^{--}$ type silicon substrate 2, the N type impurity (phosphorus) is selectively doped by an ion implantation method to form the drain offset region 4.

Figure 3B:
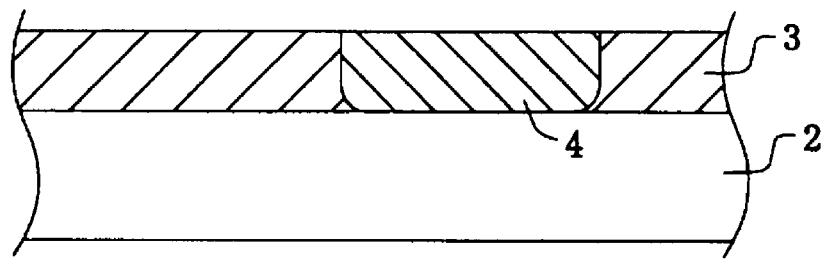

Next as shown in FIG. 3B, to the surface of the silicon substrate 2 including the drain offset region 4, the P type impurity (boron), which is lower concentrated than the N type impurity (phosphorus) ion implanted to the drain offset region 4, is doped by an ion implantation method to form the $P^-$ type punch through prevention region 3.

Then the $P^-$ type punch through prevention region 3 is formed to surround the $N^-$ type drain offset region 4 in plan view.

Here, to prevent punch through, it is effective to uniform the levels of the diffusion depth of the punch through prevention region 3 and that of the drain offset region 4, however it is not necessary.

Furthermore, as shown in FIG. 2A, ion is implanted while controlling acceleration energy so that the peak p1 of the concentration distribution in depth direction for the P type impurity (boron) and peak p2 of the concentration distribution in depth direction for the N type impurity (phosphorus) in the drain offset region 4 are in the same depth.

Moreover, dose amount is controlled so that a difference between the peak value of the P type impurity (boron) concentration and the peak value of the N type impurity (phosphorus) concentration in the drain offset region 4 is not more than $10/cm^3$.

Figure 3C:
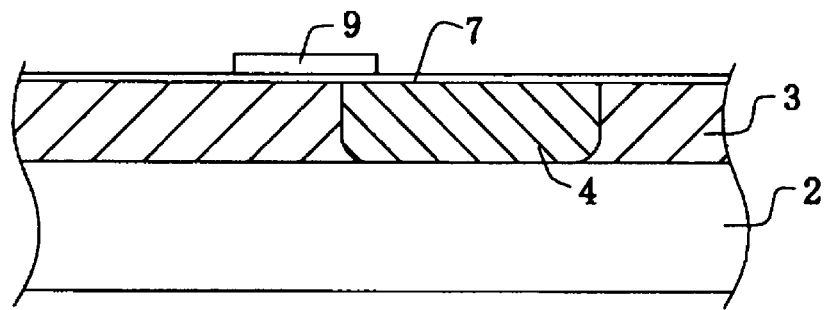

Then as shown in FIG. 3C, the thin gate insulating film 7 is formed over the surface of the silicon substrate 2. After that, the gate electrode 9 is formed by photolithography and etching methods.

Figure 3D:
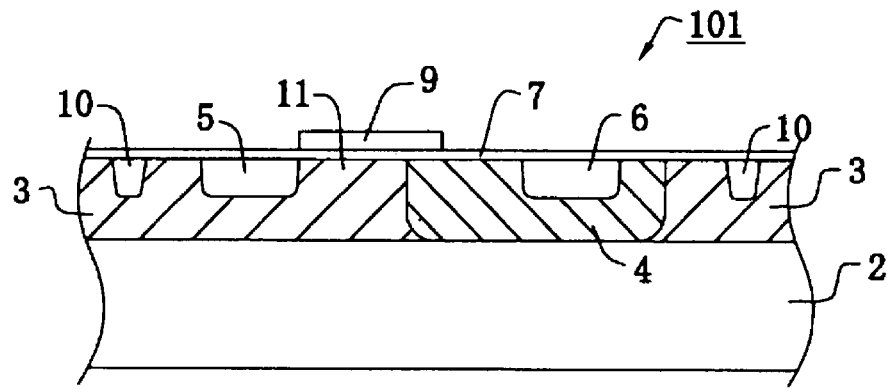

Next as shown in FIG. 3D, the $N^+$ source region 5 and $N^+$ type drain region 6 are formed by selectively doping using an ion implantation method. After that, the $P^+$ back gate region 10 for isolation is formed by an ion implantation method to complete the MOS transistor 101.

As descried above, by conforming the depth positions for the peak p1 of concentration distribution in depth direction of the P type impurity (boron) and the peak p2 of concentration distribution in depth direction of the N type impurity (phosphorus) and controlling the difference between the peak values to be not more than $10/cm^3$, the expansion width of the depletion layer can be increased, thereby obtaining a high voltage.

Another example of the present invention is described hereinafter in detail with reference to FIGS. 4A and 4B.

Figure 4A:
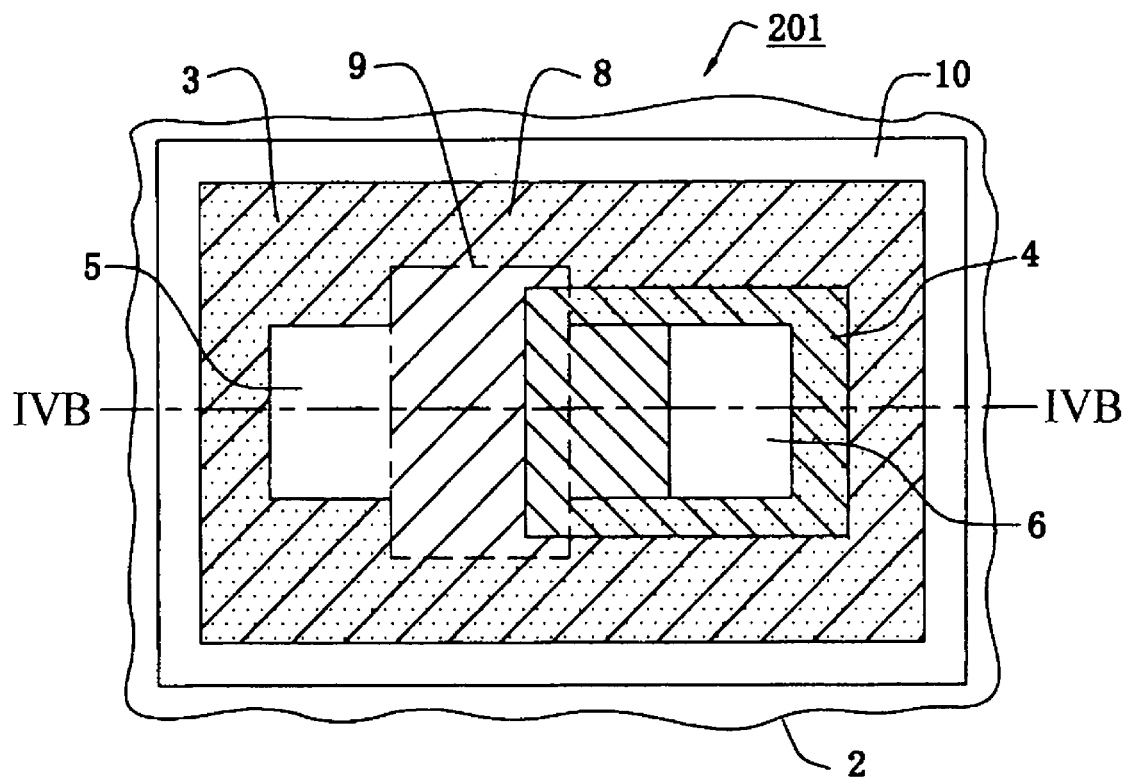
FIG. 4A is a plan view of another high voltage MOS transistor according to the present invention.

FIG. 4A is a plan view of another high voltage MOS transistor according to the present invention. FIG. 4B is a cross-sectional diagram taken along the line IVB-IVB of FIG. 4A. In FIGS. 4A and 4B, components identical to those in FIGS. 1A to 2B and 6A to 7B are denoted by reference numerals identical to those therein. Incidentally, FIG. 4A shows a state when a gate electrode is removed and a gate electrode area is indicated by a chain line.

In FIG. 4A, a high voltage MOS transistor 201 according to the present invention includes a $P^{--}$ type silicon substrate 2 and $P^-$ type punch through prevention region 3 of a first conductivity type, $N^-$ type drain offset region 4, $N^+$ type source region 5 and $N^+$ type drain region 6 of a second conductivity type, gate insulating film 7 as a first insulating film, field insulating film 8 as a second insulating film, gate electrode 9, $P^+$ type back gate region 10 and channel region 11.

Figure 4B:
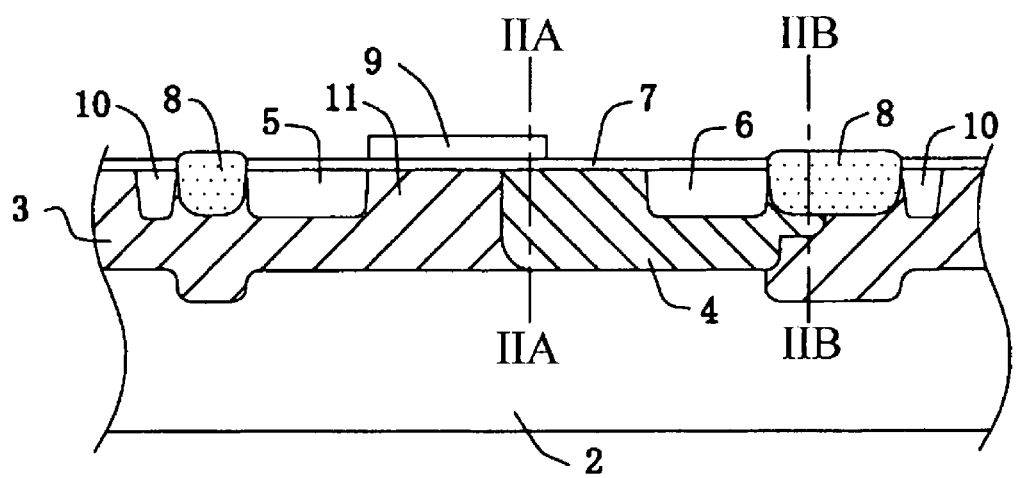
FIG. 4B is a cross-sectional diagram taken along the line IVB-IVB of FIG. 4A.

In FIGS. 4A and 4B, a difference from the embodiment shown in FIGS. 1A and 1B is that the field insulating film 8 for isolation which is thicker than the gate insulating film 7 is formed to surround the active region (source region 5, drain region 6, channel region 11 and gate electrode 9) in plan view.

That is, the field insulating film 8 is formed to shape the letter U above the periphery of the drain offset region 4 excluding the portion immediately below the gate electrode 9.

Here, in the portion immediately below the gate electrode 9 (indicated by IIA-IIA in FIG. 4B), as shown in FIG. 2A, the peak p1 of the concentration distribution in depth direction for the P type impurity (boron) and peak p2 of the concentration distribution in depth direction for the N type impurity (phosphorus) are formed to be in the same depth position.

On the other hand, in the portion immediately below the field insulating film 8 (indicated by IIB-IIB in FIG. 4B), the diffusion depth of the punch through prevention region 3 is deeper than the diffusion depth of the drain offset region 4. Further, as shown in FIG. 2B, the peak p1 of the concentration distribution in depth direction of the P type impurity (boron) is formed to be at a deeper position than the peak p2 of the concentration distribution in depth direction of the N type impurity (phosphorus).

As described above, when shifting the depth positions of the two peaks p1 and p2 for P/N type impurity concentration distributions in the drain offset region 4, a the distribution (indicated by the broken line in FIG. 2B) of effective carrier concentration which is determined by an impurity concentration difference between N and P type is formed to have 2 convex shapes with peaks p4 and p5 near the peaks p1 and p2 of the impurity concentration distribution.

Thus the depletion layer width of the PN junction portion is determined by carrier concentration profiles having two peaks of p4 and p5 and is narrower than the depletion layer width shown in FIG. 2A.

As a result, as compared to the portion immediately below the gate electrode 9, an avalanche breakdown is likely to be generated in the portion immediately below the field insulating film 8. Thus it is less likely for a parasitic bipolar transistor (NPN) Tr to operate, which is preferable.

Next a manufacturing method of the high voltage MOS transistor 201 is described hereinafter in detail with reference to FIGS. 5A to 5E. FIGS. 5A to 5E are cross-sectional diagrams.

Figure 5A:
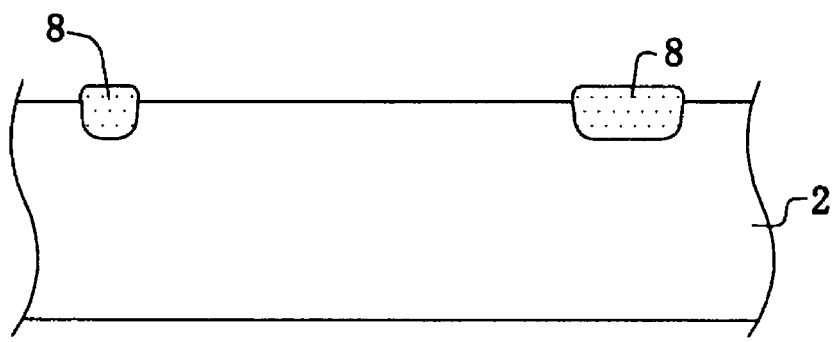
FIGS. 5A to 5E are cross-sectional diagrams of a manufacturing method of another high voltage MOS transistor according to the present invention.

As shown in FIG. 5A, the field insulating film 8 for isolation which is thicker than the gate insulating film 7 is formed over the surface of the $P^{--}$ type silicon substrate 2 to surround the area where the device is to be formed in plan view.

Figure 5B:
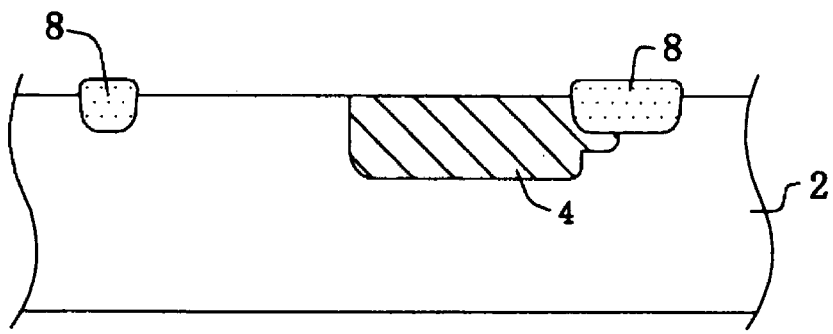

Next as shown in FIG. 5B, in the predetermined region over the surface of the silicon substrate 2, the N type impurity (phosphorus) is selectively doped by an ion implantation method to form the drain offset region 4.

Then the field insulating film 8 is formed to shape the letter U above the periphery of the drain offset region 4 excluding the portion where the gate electrode 9 is to be formed.

Figure 5C:
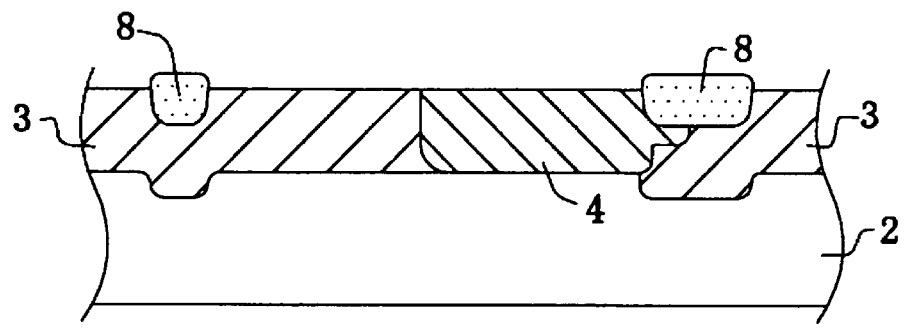

Next as shown in FIG. 5C, to the surface of the silicon substrate 2 including the drain offset region 4, the P type impurity (boron) which is lower concentrated than the N type impurity (phosphorus) ion implanted to the drain offset region 4 is doped by an ion implantation method to form the $P^-$ type punch through prevention region 3.

Then the $P^-$ type punch through prevention region 3 is formed to surround and in contact with the $N^-$ type drain offset region 4 in plan view.

Here, among the periphery of the drain offset region 4, in the region where the field insulating film 8 is not formed thereabove, as shown in FIG. 2A, ion is implanted while controlling acceleration energy so that the peak p1 of the concentration distribution in depth direction for the P type impurity (boron) and peak p2 of the concentration distribution in depth direction for the N type impurity (phosphorus) in the drain offset region 4 are the same depth position.

Then, dose amount is controlled so that a difference between the peak value of the P type impurity (boron) concentration and the peak value of the N type impurity (phosphorus) concentration in the drain offset region 4 is not more than $10/cm^3$.

On the other hand, in the periphery of the drain offset region 4, in the region where the field insulating film 8 is formed thereabove, as shown in FIG. 2B, the peak 1 of the concentration distribution in depth direction of the P type impurity (boron) is formed deeper than the peak 2 of the concentration distribution in depth direction of the N type impurity (phosphorus).

Note that in an ion implantation method, this is generated because range distances for the P type impurity (boron) and the N type impurity (phosphorus) into the silicon substrate 2 and into the field insulating film 8 are different.

That is, in the region where the field insulating film 8 is not formed, when implanting an ion while controlling acceleration energy so that the diffusion depth of the P type impurity (boron) and the N type impurity (phosphorus) are to be the same, in the region having the field insulating film 8, the P type impurity (boron) is implanted deeper than the diffusion depth for the region with no field insulating film 8. On the other hand, the N type impurity (phosphorus) is implanted shallower than the diffusion depth for the region with field insulating film 8.

Therefore, in the region where the field insulating film 8 is formed on the surface, the peaks p1 and p2 do not match.

Figure 5D:
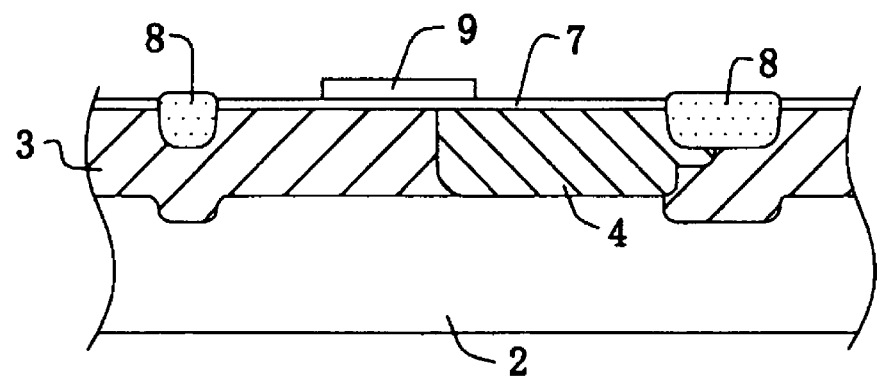

Then as shown in FIG. 5D, the thin gate insulating film 7 is formed over the surface of the silicon substrate 2. After that, the gate electrode 9 is formed by photolithography and etching methods.

Figure 5E:
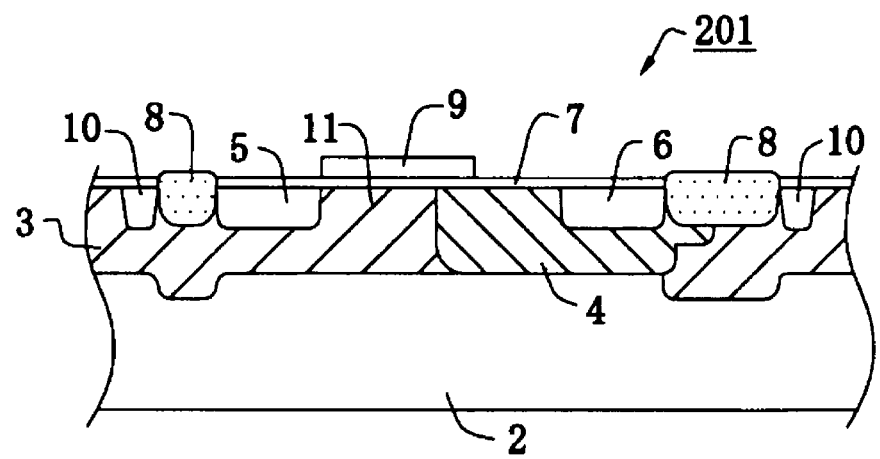
Figure 6A:
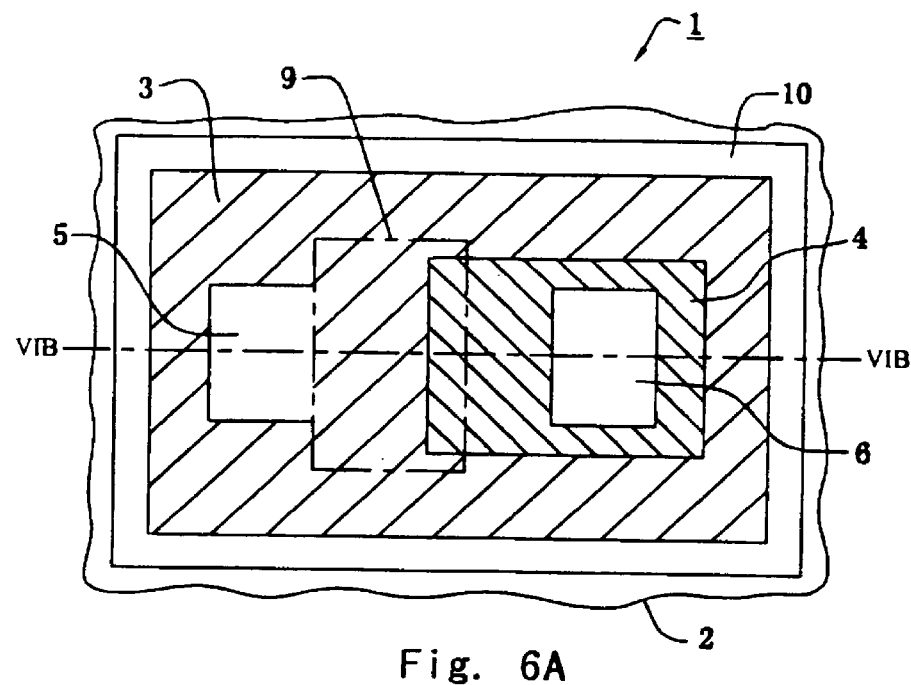
FIG. 6A is a plan view of an example of a conventional high voltage MOS transistor.
Figure 6B:
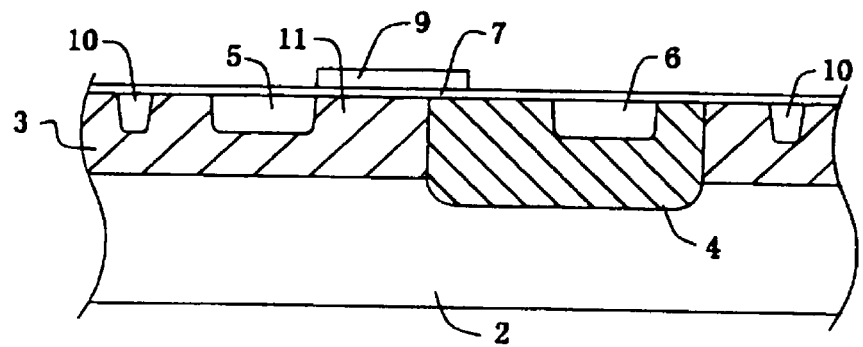
FIG. 6B is a cross-sectional diagram taken along the line VIB-VIB of FIG. 6A.
Figure 7A:
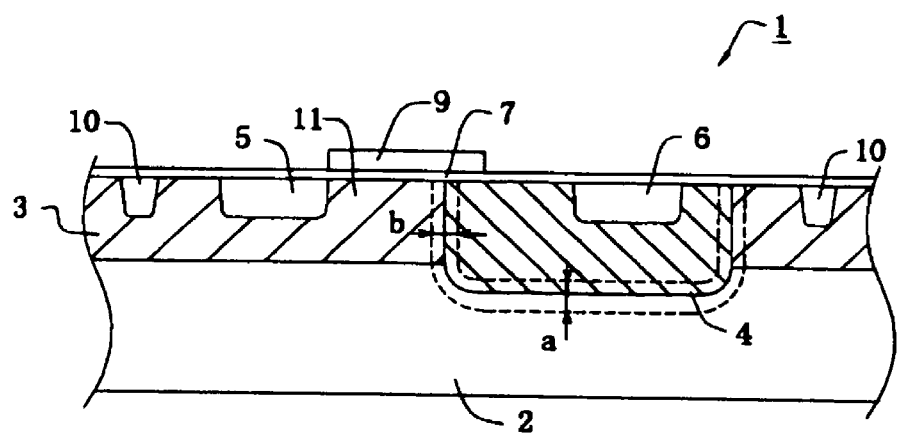
FIGS. 7A and 7B are cross-sectional diagrams explaining a problem in the conventional high voltage MOS transistor.
Figure 7B:
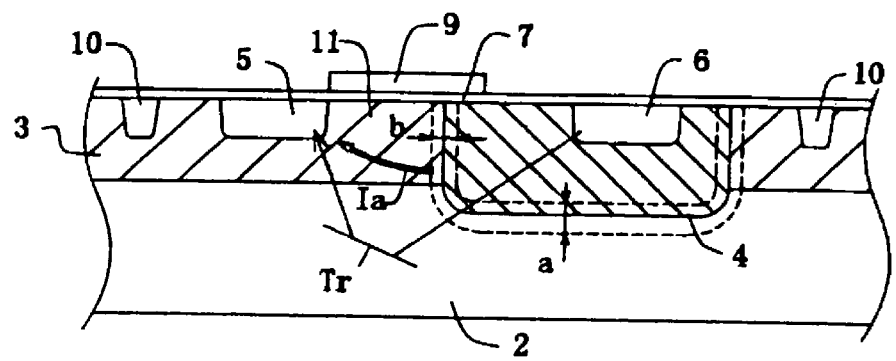

Next as shown in FIG. 5E, the N$^+$ source region 5 and N$^+$ type drain region 6 are formed by selectively doping using an ion implantation method. After that, the P$^+$ back gate region 10 for isolation is formed by an ion implantation method to complete the MOS transistor 201.

As described above, by providing the thick field insulating film 8 in the region excluding the gate electrode 9 and performing an ion implantation using the fact that a range distance of the P type impurity (boron) and the N type impurity (phosphorus) differs according to whether the field insulating film 8 exists or not, in the portion immediately below the gate electrode 9, the peaks p1 and p2 of P/N type impurities are matched but except the portion immediately below the gate electrode 9, the depth position of the peaks p4 and p5 of the P/N type impurity concentrations can be differed, which is preferable.

It is apparent that the present invention is not limited to the above embodiment but may be modified and changed without departing from the scope and spirit of the invention.

What is claimed is:

1. A semiconductor device comprising:
   a gate electrode formed over a semiconductor substrate of a first conductivity type with a first insulating film interposed therebetween;
   a source region and a drain offset region of a second conductivity type formed away and facing each other over a surface of the semiconductor substrate with a channel region interposed therebetween, the channel region being formed immediately below the gate electrode;
   a drain region of the second conductivity type formed to be included in the drain offset region; and
   a punch through prevention region of the first conductivity type formed to be in contact with the drain offset region,
   wherein, in a portion immediately below the gate electrode, peaks of concentration distribution in a depth direction of a first conductivity type impurity and a second conductivity type impurity in the drain offset region are in a same depth, the second conductivity type impurity being higher concentrated than the first conductivity type impurity.

2. The semiconductor device according to claim 1, wherein the difference of the concentration peak value between the first conductivity type impurity and the second conductivity type impurity is not more than 10/cm$^3$.

3. The semiconductor device according to claim 1, further comprising a second insulating film formed on the surface of the drain offset region except immediately below the gate electrode, the second insulating film being thicker than the first insulating film,
   wherein, in a portion immediately below the second insulating film, peaks of concentration distribution in a depth direction of the first conductivity type impurity and the second conductivity type impurity in the drain offset region are in a different depth, the second conductivity type impurity being higher concentrated than the first conductivity type impurity.

4. The semiconductor device according to claim 2, further comprising a second insulating film formed on the surface of the drain offset region except immediately below the gate electrode, the second insulating film being thicker than the first insulating film,
   wherein, in a portion immediately below the second insulating film, peaks of concentration distribution in a depth direction of the first conductivity type impurity and the second conductivity type impurity in the drain offset region are in a different depth, the second conductivity type impurity being higher concentrated than the first conductivity type impurity.

5. The semiconductor device according to claim 1, wherein a distribution of a difference of the concentration peak value between the first conductivity type impurity and the second conductivity type impurity comprises substantially a convex shape.

6. The semiconductor device according to claim 5, wherein the peak of the distribution of the difference of the concentration peak value between the first conductivity type impurity and the second conductivity type impurity is formed to substantially a same depth as the peaks of concentration distribution of the first conductivity type impurity and a second conductivity type impurity in the drain offset region below the gate electrode.

7. The semiconductor device according to claim 1, further comprising a second insulating film formed on a surface of the drain offset region except below the gate electrode, the second insulating film being thicker than the first insulating film,
   wherein, in a portion below the second insulating film, peaks of concentration distribution in a depth direction of the first conductivity type impurity and the second conductivity type impurity in the drain offset region are in a different depth.

8. The semiconductor device according to claim 1, wherein a concentration distribution in the depth direction of a first conductivity type impurity comprises a shape substantially similar to a concentration distribution of second conductivity type impurity throughout the depth of the drain offset region.

9. The semiconductor device according to claim 1, wherein a concentration distribution in the depth direction of a first conductivity type impurity is less than a concentration distribution of second conductivity type impurity throughout the depth of the drain offset region.

10. The semiconductor device according to claim 1, wherein both a concentration distribution in the depth direction of a first conductivity type impurity and a concentration distribution of second conductivity type impurity throughout the depth of the drain offset region comprise a substantially convex shape.

11. The semiconductor device according to claim 2, further comprising a second insulating film formed on a surface of the drain offset region except below the gate electrode,
   wherein in a portion below the second insulating film, peaks of concentration distribution in the depth direction of the first conductivity type impurity and the second conductivity type impurity in the drain offset region are in different depths.

12. A semiconductor device comprising:
   a gate electrode formed over a semiconductor substrate of a first conductivity type with a first insulating film interposed therebetween;

a source region and a drain offset region of a second conductivity type formed away and facing each other over a surface of the semiconductor substrate with a channel region interposed therebetween, the channel region being formed below the gate electrode;

a drain region of the second conductivity type formed to be included in the drain offset region; and a punch through prevention region of a first conductivity type formed to be in contact with the drain offset region, wherein, in a portion of the drain offset region below the gate electrode, peaks of concentration distribution in a depth direction of a first conductivity type impurity and a second conductivity type impurity in the drain offset region are in substantially a same depth.

13. The semiconductor device according to claim 12, wherein the second conductivity type impurity is being higher concentrated than the first conductivity type impurity.

14. The semiconductor device according to claim 12, wherein the difference of the concentration peak value between the first conductivity type impurity and the second conductivity type impurity is not more than $10/cm^3$.

15. The semiconductor device according to claim 12, further comprising a second insulating film formed on a surface of the drain offset region except immediately below the gate electrode, the second insulating film being thicker than the first insulating film.

16. The semiconductor device according to claim 15, wherein, in a portion below the second insulating film, peaks of concentration distribution in the depth direction of the first conductivity type impurity and the second conductivity type impurity in the drain offset region are in different depth, the second conductivity type impurity being higher concentrated than the first conductivity type impurity.

* * * * *